(12) United States Patent
Yoo et al.

(10) Patent No.: US 9,349,667 B2
(45) Date of Patent: May 24, 2016

(54) METHOD OF MANUFACTURING STACKED PACKAGE

(71) Applicant: STS SEMICONDUCTOR & TELECOMMUNICATIONS CO., LTD., Cheonan-si, Chungcheongnam-do (KR)

(72) Inventors: Jae Bok Yoo, Jeonju-si (KR); Hyun Hak Jung, Cheonan-si (KR); Kyoung Min Song, Cheonan-si (KR)

(73) Assignee: STS SEMICONDUCTOR & TELECOMMUNICATIONS CO., LTD. (KR)

( * ) Notice: Subject to any disclaimer, the term of this patent is extended or adjusted under 35 U.S.C. 154(b) by 43 days.

(21) Appl. No.: 14/255,274

(22) Filed: Apr. 17, 2014

(65) Prior Publication Data
US 2015/0228507 A1    Aug. 13, 2015

(30) Foreign Application Priority Data

Feb. 11, 2014    (KR) .................. 10-2014-0015416

(51) Int. Cl.
| | |
|---|---|
| *H01L 23/31* | (2006.01) |
| *H01L 21/56* | (2006.01) |
| *H01L 23/498* | (2006.01) |
| *H01L 23/00* | (2006.01) |
| *H01L 25/10* | (2006.01) |

(52) U.S. Cl.
CPC ............ *H01L 23/3128* (2013.01); *H01L 21/56* (2013.01); *H01L 23/49811* (2013.01); *H01L 23/49816* (2013.01); *H01L 24/16* (2013.01); *H01L 24/48* (2013.01); *H01L 25/105* (2013.01); *H01L 2224/16225* (2013.01); *H01L 2224/48227* (2013.01); *H01L 2225/1023* (2013.01); *H01L 2924/12042* (2013.01); *H01L 2924/1533* (2013.01); *H01L 2924/15311* (2013.01); *H01L 2924/1815* (2013.01)

(58) Field of Classification Search
CPC ............ H01L 21/56–21/568; H01L 23/49811
See application file for complete search history.

(56) References Cited

U.S. PATENT DOCUMENTS

| | | | |
|---|---|---|---|
| 2004/0154163 A1* | 8/2004 | Miyazaki et al. | ............... 29/832 |
| 2008/0017968 A1* | 1/2008 | Choi et al. | .................... 257/686 |

* cited by examiner

Primary Examiner — Daniel Shook

(57) ABSTRACT

A method of manufacturing a stacked package includes a first process of stacking a semiconductor chip on an upper surface of a PCB having a wiring pattern and a via-hole pad, a second process of forming a photoresist (PR) layer on the upper surface of the PCB having the semiconductor chip and the via-hole pad, a third process of removing the photoresist layer of a remaining region except for an upper portion of the via-hole pad so that a photoresist layer of a via-hole region remains only at the upper portion of the via-hole pad, a fourth process of forming a molding layer by molding the upper surface of the PCB having the semiconductor chip to expose an upper surface of the photoresist layer of the via-hole region, and a fifth process of removing the photoresist layer of the via-hole region to form a via-hole on the via-hole pad.

9 Claims, 6 Drawing Sheets

METHOD OF MANUFACTURING STACKED PACKAGE

BACKGROUND OF THE INVENTION

1. Field of the Invention

The present invention relates to a method of manufacturing an IC (Integrated Circuit) package, and more particularly to a method of manufacturing a stacked package having a PoP (Package on Package) structure.

2. Description of the Related Art

A semiconductor industry generally has an increasing trend of lightening, miniaturization, multifunction, and high performance in addition to cheap production. One critical technique required to meet such a trend is IC packaging.

IC packaging involves protecting semiconductor chips such as a single device and an IC formed by stacking a variety of electronic circuits and wirings from various external environments such as dust, moisture, and electric and mechanical loads, forming the semiconductor chips with signal input/output terminals to/from a main board using a lead frame, a PCB (Printed Circuit Board), or the like to optimize and maximize electric performance of the semiconductor chips, and molding the semiconductor chips using an encapsulant.

Meanwhile, as products to which an IC package is mounted recently have a light, thin, short, and small structure and require many functions, a method such as a SIP (System in Package) method or a PoP (Package on Package) method by which a plurality of semiconductor chips is mounted in the IC package is applied as the IC packaging technique.

Moreover, a PCB on which high-integrated and ultrathin components are mounted should also be thin. This enables increased freedom in circuit design of the board, and thus various techniques such as a micro via process and a build-up process are adopted to solve the issue.

In particular, a micro via-hole is receiving attention as a method for satisfying high integration and fine wiring pitch demand as a degree of integration of a semiconductor device is currently increased.

In particular, an MLB (multi layer board) is configured only by a through-hole passing through all layers. However, a blind via-hole through which interlayer conduction may be selectively performed is in the limelight since a build-up PCB further requires high-density wirings.

A mechanical drilling process, a plasma etching process, a laser drilling process, or the like is generally known as a method of forming the blind via-hole of the PCB.

In particular, the laser process is currently the most widely used method to form the blind via-hole of the PCB and includes processes using excimer, Nd:YAG, and $CO_2$ laser drills.

FIGS. 1A to 1C are views illustrating a process of forming via-holes by a conventional laser drilling process. First, a semiconductor chip 20 is stacked on a PCB 10 and then a molding portion 30 is formed, as shown in FIG. 1A. Next, laser drilling positions 40 are determined on parts of the molding portion 30 to be formed with via-holes by the coordinate and then the parts are drilled using a laser, as shown in FIG. 1B. Consequently, TMVs (Through Mold Vias) 50 are formed as shown in FIG. 1C.

However, the laser drilling process has a limit to realize a fine pitch equal to or less than 0.3 mm. Since a laser drilling position is determined on an upper surface of a mold with no mark by the coordinate after an EMC molding process in the laser drilling process, a via-hole may be formed at an inaccurate position, thereby causing an error.

Moreover, process equipment such as a plasma cleaner, a reflow M/C, a flux cleaner, and an off-loader may be additionally required in order to remove residues generated during the laser drilling process. Since the laser equipment is expensive, equipment investment may be costly.

[Patent Document 0001] Korean Patent Publication No. 10-0674316 (Jan. 18, 2007)

SUMMARY OF THE INVENTION

Therefore, the present invention has been made in view of the above problems, and it is an object of the present invention to provide a method of manufacturing a stacked package, capable of substantially compensating for many defects of the related art.

It is another object of the present invention to provide a method of manufacturing a stacked package, capable of processing a fine pitch equal to or less than 0.3 mm at low cost.

In accordance with one aspect of the present invention, a method of manufacturing a stacked package includes a first process of stacking a semiconductor chip on an upper surface of a PCB having a wiring pattern and a via-hole pad, a second process of forming a photoresist (PR) layer on the upper surface of the PCB having the semiconductor chip and the via-hole pad, a third process of removing the photoresist layer of a remaining region except for an upper portion of the via-hole pad so that a photoresist layer of a via-hole region remains only at the upper portion of the via-hole pad, a fourth process of forming a molding layer by molding the upper surface of the PCB having the semiconductor chip so as to expose an upper surface of the photoresist layer of the via-hole region, and a fifth process of removing the photoresist layer of the via-hole region to form a via-hole on the via-hole pad.

In the method of manufacturing a stacked package according to one aspect of the present invention, the third process may be performed by a photolithographic process using a photomask.

In the method of manufacturing a stacked package according to one aspect of the present invention, the semiconductor chip may be stacked by flip-chip bonding or wire bonding.

In accordance with another aspect of the present invention, a method of manufacturing a stacked package includes a first process of forming a photoresist (PR) layer on an upper surface of a PCB having a wiring pattern and a via-hole pad, a second process of removing the photoresist layer of a remaining region except for an upper portion of the via-hole pad so as to form a photoresist layer of a via-hole region at the upper portion of the via-hole pad, a third process of stacking a semiconductor chip on the upper surface of the PCB, a fourth process of forming a molding layer by molding the upper surface of the PCB having the semiconductor chip so as to expose an upper surface of the photoresist layer of the via-hole region, and a fifth process of removing the photoresist layer of the via-hole region to form a via-hole on the via-hole pad.

In the method of manufacturing a stacked package according to another aspect of the present invention, the second process may be performed by a photolithographic process using a photomask.

In the method of manufacturing a stacked package according to another aspect of the present invention, the semiconductor chip may be stacked by flip-chip bonding or wire bonding.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
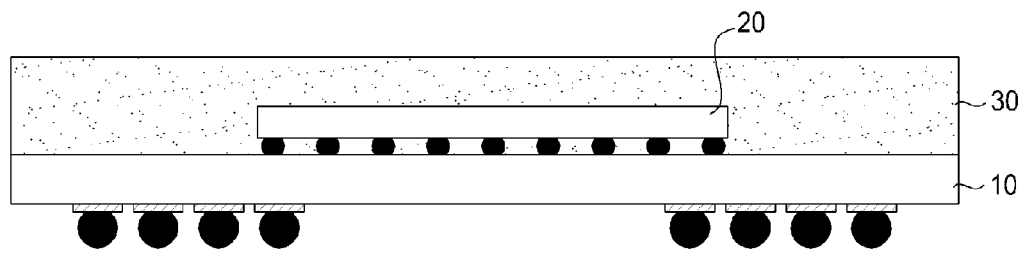
FIGS. 1A to 1C are cross-sectional views illustrating a method of manufacturing a stacked package according to the related art.
Figure 1B:
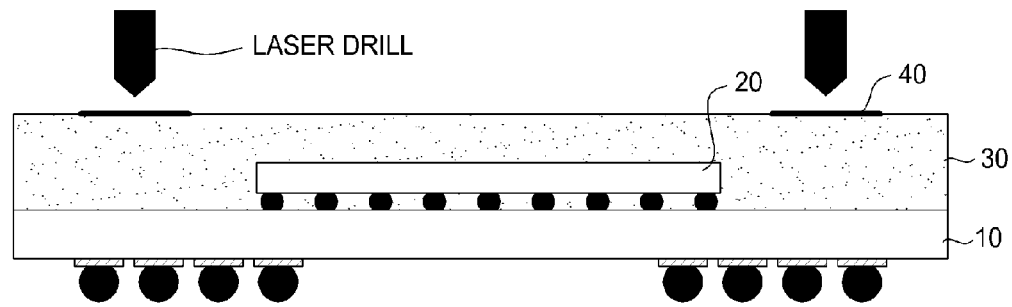
Figure 1C:
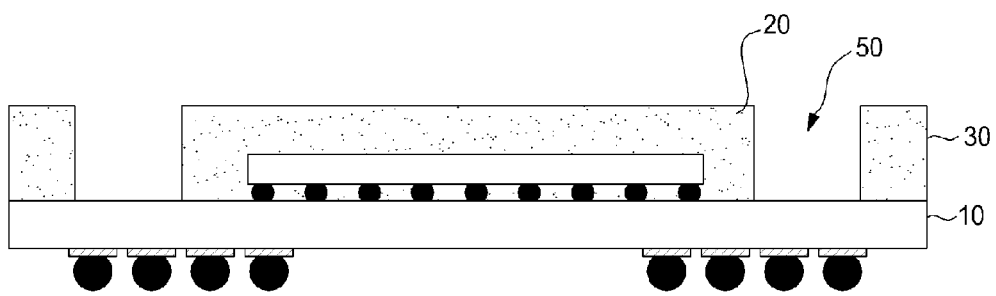

Reference will now be made in detail to the embodiments of the present invention, examples of which are illustrated in the accompanying drawings, wherein like reference numerals refer to like elements throughout.

In a case in which it is determined that a detailed description of known relevant technologies or configurations may unnecessarily obscure the gist of the present invention in the description thereof, the detailed description thereof will be omitted. In addition, terms used herein are defined in consideration of functions of the present invention, and these may vary with the intention or practice of a user. Therefore, unless otherwise defined, all terms used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure.

FIGS. 2A to 2F are views illustrating a method of manufacturing a stacked package according to an embodiment of the present invention.

Figure 2A:
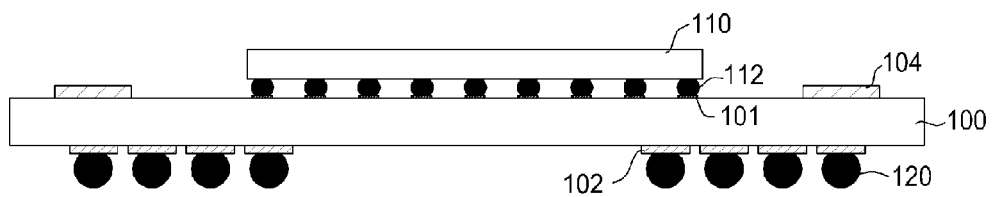
FIGS. 2A to 2F are views illustrating a method of manufacturing a stacked package according to an embodiment of the present invention.

First, as shown in FIG. 2A, a structure of attaching a semiconductor chip 110 on a PCB 100 is prepared. In FIG. 2A, while the semiconductor chip 110 has a flip-chip attach structure 112 which is electrically connected to the PCB, the semiconductor chip 110 may also have a structure which is connected to the PCB by wire bonding.

Wiring patterns 101 and 102 and via-hole pads 104 are formed on the PCB 100. Although not shown, the PCB 100 has via contacts for electrically connecting the wiring patterns 101 and 102 on upper and lower surfaces of the PCB to each other.

In addition, the PCB 100 is provided, on a lower surface thereof, with solder balls 120.

Figure 2B:
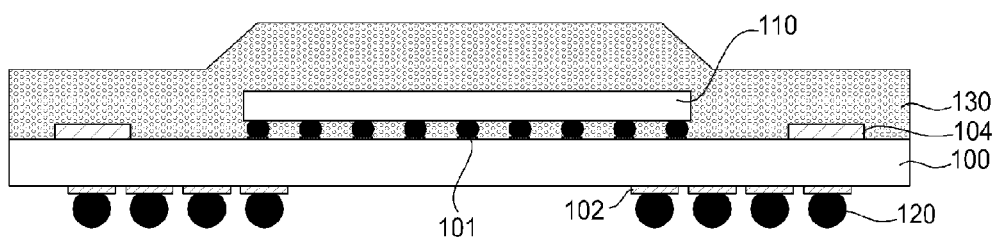

Next, as shown in FIG. 2B, photoresist (PR) is applied (coated) to the whole surface of the PCB 100 on which the semiconductor chip 110 is attached. In this case, the formed photoresist layer 130 has a thickness which is set to be slightly thicker in consideration of a height of a via-hole to be formed later. The photoresist refers to a material in which a portion receiving light and the other portion may be selectively removed during a subsequent developing process using properties by which solubility in developer is changed when the material receives light having a specific wavelength.

In order to remove an organic solvent remaining on the photoresist after coating, soft bake is carried out at a low temperature. The soft bake enables exposure equipment and mask contamination due to residual solvent to be prevented and photoresist reaction characteristics to be uniformly maintained. In the soft bake, the solvent is typically removed by being heated at a temperature of approximately 90° C. to 110° C., thereby allowing photoresist density to be increased so as to reduce sensitivity to environmental change.

Figure 2C:
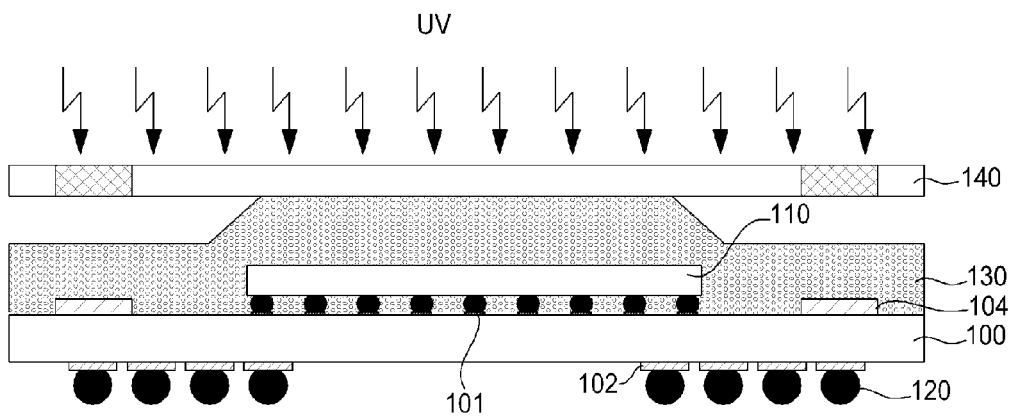

Next, as shown in FIG. 2C, a photomask 140 is aligned on the photoresist layer 130 and then an exposure process is performed by irradiating UV light onto the photomask 140. In this case, the photomask 140 has patterns formed at via-hole regions so as not to irradiate UV light onto the lower photoresist layer 130. In addition, the photomask has a mask image which is projected at a 1:1 ratio and a mask image which is decreased and projected at a certain ratio. The 1:1 ratio is utilized when the pattern has a size equal to or more than 1 µm or the shape of the pattern is completed at an overall exposed area. In this case, UV light is irradiated onto the mask in a state in which the mask comes into contact with the PR. In a case in which the pattern size is equal to or less than 1 µm or the same pattern shape is continuously repeated, after the pattern size is magnified in integer multiples (typically four multiples) of a desired pattern size in the mask, UV light is irradiated onto the upper and lower surfaces of the mask using a reduced optical system (lens) in a state in which the mask and the PR are maintained to be spaced apart from the coated wafer by a proper distance.

After exposure is completed, bake is carried out once again. The PEB (post exposure bake) process is a process of forming a pattern through diffusion of photoresist. In ArF photoresist using a 193 nm wavelength, a chemical amplified resist is frequently used. In this case, since a chemical amplified reaction is generated through the PEB process, the temperature of the PEB affects sensitivity of photoresist.

Figure 2D:
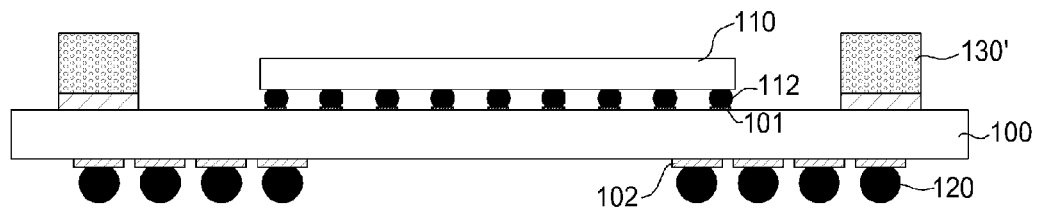

Next, as shown in FIG. 2D, the remaining photoresist layer 130 is removed except for photoresist layers 130' of the via-hole regions via a developing process. The photoresist developer may be a water-soluble alkaline solution and uses KOH and TMAH (TetraMethyl-Ammonium-Hydroxide) aqueous solutions as main materials.

After developing is completed, the developer is removed and hard bake may be performed as occasion demands.

Figure 2E:
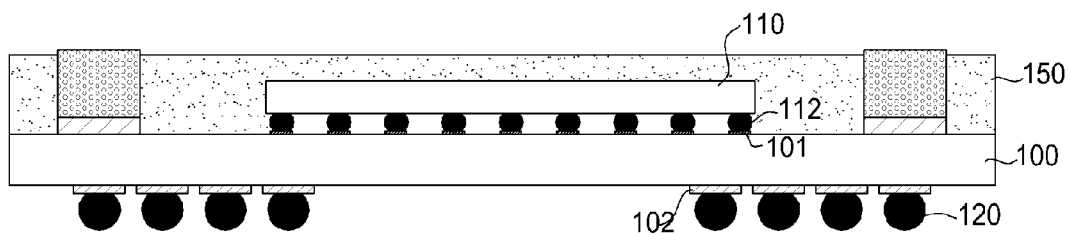

Next, as shown in FIG. 2E, the overall upper surface of the PCB 100 including the photoresist layers 130' of the via-hole regions and the semiconductor chip 110 is molded via a molding process so as to form a molding layer 150.

Figure 2F:
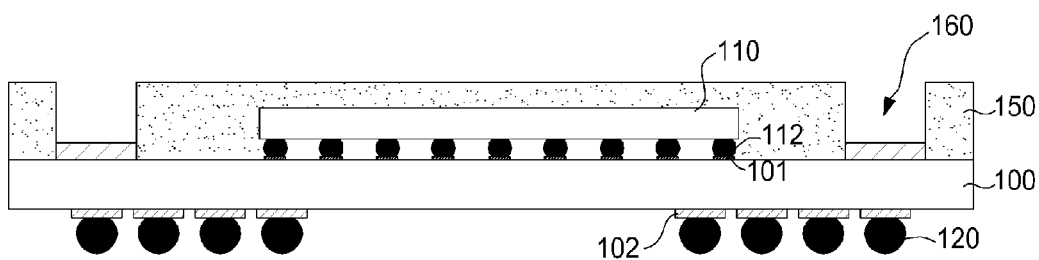

Next, as shown in FIG. 2F, the photoresist layers 130' of the via-hole regions are removed via a photoresist strip process so as to form via-holes 160.

As described above, since the via-holes are formed in the PCB by the photolithographic process according to the embodiment, it may be possible to realize a fine pitch equal to or less than 0.3 mm and improve position accuracy of the via-holes.

In addition, it may be possible to prevent EMC residues from being generated when the via-holes are formed by the conventional laser drilling process.

FIGS. 3A to 3G are views illustrating a method of manufacturing a stacked package according to another embodiment of the present invention.

Figure 3A:
FIGS. 3A to 3G are views illustrating a method of manufacturing a stacked package according to another embodiment of the present invention.

First, as shown in FIG. 3A, a PCB 200 provided with wiring patterns 201 and 202 and via-hole pads 204 is prepared. The PCB 200 has via contacts (not shown) for electrically connecting the wiring patterns 201 and 202 on upper and lower surfaces of the PCB to each other. The lower surface of the PCB 200 is provided with solder balls 220.

Figure 3B:
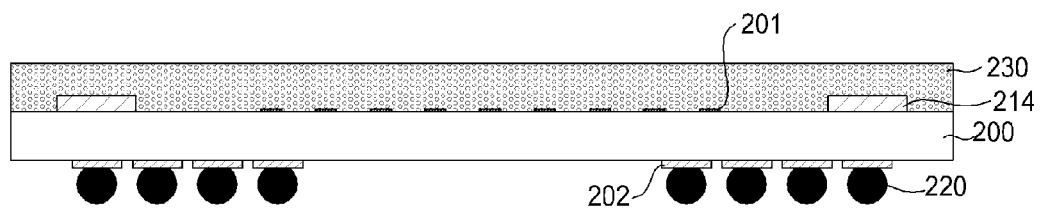

Next, as shown in FIG. 3B, photoresist (PR) is applied (coated) to the whole surface of the PCB 200 on which a semiconductor chip is attached. In this case, the formed photoresist layer 230 has a thickness which is set to be slightly thicker in consideration of a height of a via-hole to be formed later. The photoresist refers to a material in which a portion receiving light and the other portion may be selectively removed during a subsequent developing process using properties by which solubility in developer is changed when the material receives light having a specific wavelength.

In order to remove an organic solvent remaining on the photoresist after coating, soft bake is carried out at a low temperature. The soft bake enables exposure equipment and mask contamination due to residual solvent to be prevented and photoresist reaction characteristics to be uniformly maintained. In the soft bake, the solvent is typically removed by being heated at a temperature of approximately 90° C. to 110° C., thereby allowing photoresist density to be increased so as to reduce sensitivity to environmental change.

Figure 3C:
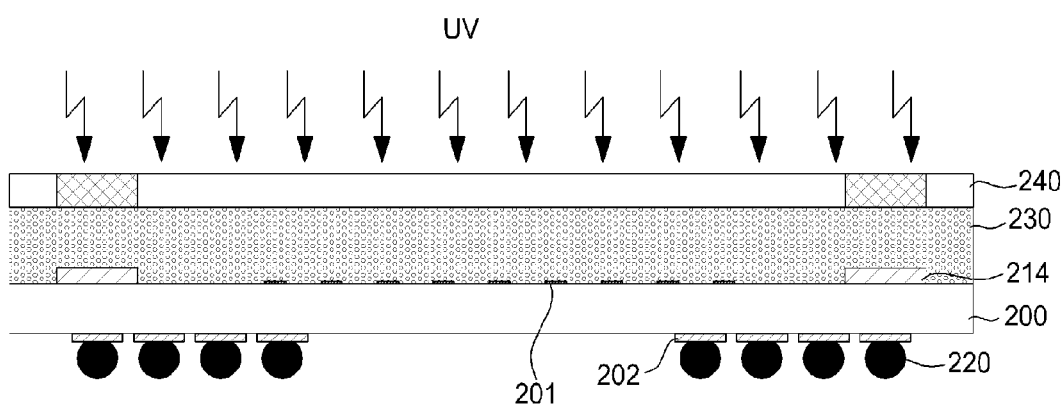

Next, as shown in FIG. 3C, a photomask 240 is aligned on the photoresist layer 230 and then an exposure process is performed by irradiating UV light onto the photomask 240. In this case, the photomask 240 has patterns formed at via-hole regions so as not to irradiate UV light onto the lower photoresist layer 230.

After exposure is completed, bake is carried out once again. The PEB (post exposure bake) process is a process of forming a pattern through diffusion of photoresist. In ArF photoresist using a 193 nm wavelength, a chemical amplified resist is frequently used. In this case, since a chemical amplified reaction is generated through the PEB process, the temperature of the PEB affects sensitivity of photoresist.

Figure 3D:
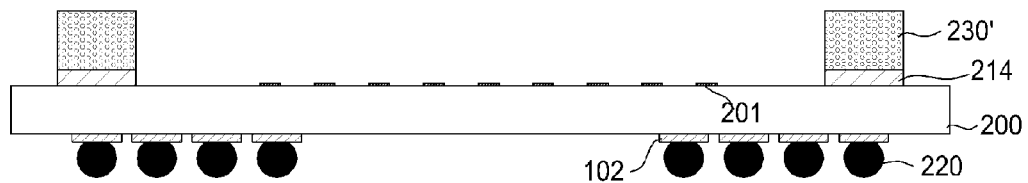

Next, as shown in FIG. 3D, the photoresist layer 230 formed at the remaining portion except for the via-hole regions is removed via a developing process. The photoresist developer may be a water-soluble alkaline solution and uses KOH and TMAH (TetraMethyl-Ammonium-Hydroxide) aqueous solutions as main materials. After developing is completed, the developer is removed and hard bake may be performed as occasion demands.

Figure 3E:
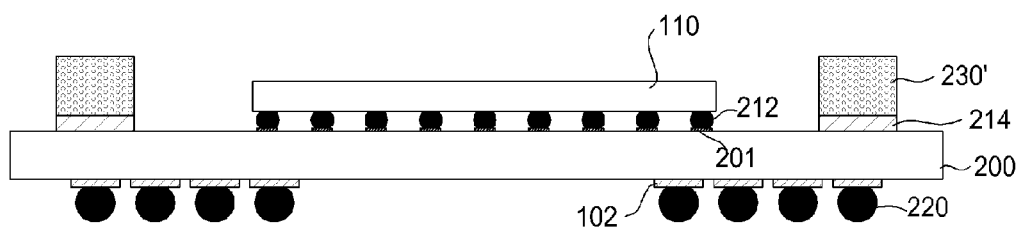

Next, as shown in FIG. 3E, a semiconductor chop 210 is attached on the PCB 200. In FIG. 3E, while the semiconductor chip 210 has a flip-chip attach structure 212 which is electrically connected to the PCB 200, the semiconductor chip 210 may also have a structure which is connected to the PCB by wire bonding.

Figure 3F:
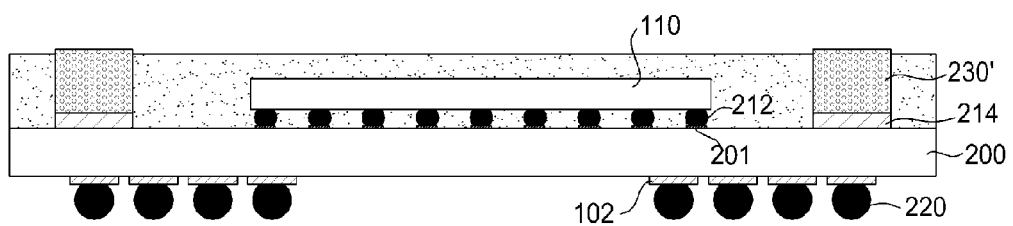

Next, as shown in FIG. 3F, the overall upper surface of the PCB 100 including the photoresist layers 230' of the via-hole regions and the semiconductor chip 210 is molded via a molding process so as to form a molding portion 250.

Figure 3G:
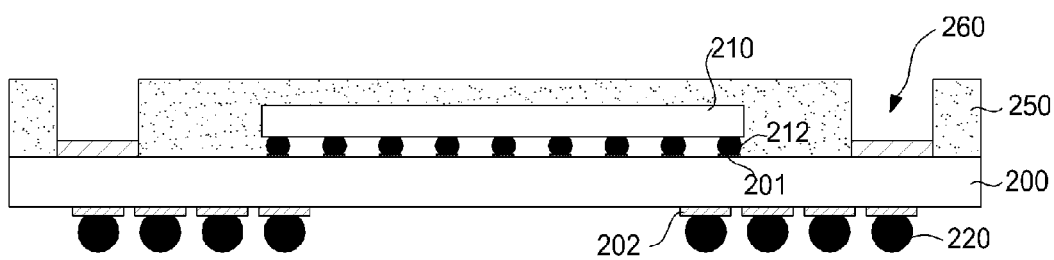

Next, as shown in FIG. 3G, the photoresist layers 230' of the via-hole regions are removed via a photoresist strip process so as to form via-holes 260.

As described above, since the via-holes are formed in the PCB by the photolithographic process according to the embodiment, it may be possible to realize a fine pitch equal to or less than 0.3 mm and improve position accuracy of the via-holes.

In addition, it may be possible to prevent EMC residues from being generated when the via-holes are formed by the conventional laser drilling process.

As is apparent from the above description, in accordance with a method of manufacturing a stacked package according to the present invention, it may be possible to reduce an economic burden of investment in expensive laser equipment because a lithographic patterning technique using photoresist is utilized.

In addition, it may be possible to improve position accuracy by directly forming a photoresist pattern on a via-hole pad of a PCB.

Moreover, it may be possible to prevent generation of misalignment, ball bridge, missing ball, and the like by a laser drilling process.

Furthermore, an additional process for removing EMC residues generated by the laser drilling process may be omitted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, it is to be understood that differences relevant to the variations and modifications fall within the spirit and scope of the present disclosure defined in the appended claims.

What is claimed is:

1. A method of manufacturing a stacked package, comprising:
    a first process of stacking a semiconductor chip on an upper surface of a Printed Circuit Board (PCB) having a wiring pattern and a via-hole pad;
    a second process of forming a photoresist (PR) layer on the upper surface of the PCB having the semiconductor chip and the via-hole pad;
    a third process of removing the photoresist layer of a remaining region except for an upper portion of the via-hole pad so that a photoresist layer of a via-hole region remains only at the upper portion of the via-hole pad;
    a fourth process of forming a molding layer by molding the upper surface of the PCB having the semiconductor chip except for the photoresist layer of the via-hole region so as to expose an upper surface of the photoresist layer of the via-hole region; and
    a fifth process of removing the photoresist layer of the via-hole region to form a via-hole on the via-hole pad.

2. The method according to claim 1, wherein the third process is performed by a photolithographic process using a photomask.

3. The method according to claim 1, wherein the semiconductor chip, in the first process, is stacked by flip-chip bonding or wire bonding.

4. The method according to claim 1, further comprising:
    between the second process and the third process, baking the photoresist layer to remove an organic solvent remained therein, wherein the photoresist layer is baked at a temperature between 90° C. and 110° C.

5. The method according to claim 4, further comprising, before the third process of removing the photoresist layer, aligning a photomask having a pattern corresponding to the via-hole pad on the photoresist layer and irradiating ultraviolet light onto the photomask.

6. The method according to claim 5, further comprising, after the irradiating of the ultraviolet light, baking the photoresist layer.

7. A method of manufacturing a stacked package, comprising:
    a first process of forming a photoresist (PR) layer on an upper surface of a Printed Circuit Board (PCB) having a wiring pattern and a via-hole pad;
    a second process of removing the photoresist layer of a remaining region except for an upper portion of the via-hole pad so as to form a photoresist layer of a via-hole region at the upper portion of the via-hole pad;
    a third process of stacking a semiconductor chip on the upper surface of the PCB;
    a fourth process of forming a molding layer by molding the upper surface of the PCB having the semiconductor chip except for the photoresist layer of the via-hole region so as to expose an upper surface of the photoresist layer of the via-hole region; and a fifth process of removing the photoresist layer of the via-hole region to form a via-hole on the via-hole pad.

8. The method according to claim 7, wherein the second process is performed by a photolithographic process using a photomask.

9. The method according to claim 7, wherein the semiconductor chip, in the third process, is stacked by flip-chip bonding or wire bonding.

* * * * *